(12) United States Patent
Ema et al.

(10) Patent No.: US 6,706,580 B2
(45) Date of Patent: Mar. 16, 2004

(54) SEMICONDUCTOR MEMORY OF GOOD RETENTION AND ITS MANUFACTURE

(75) Inventors: Taiji Ema, Kawasaki (JP); Koichi Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 09/935,749

(22) Filed: Aug. 24, 2001

(65) Prior Publication Data

US 2002/0000577 A1 Jan. 3, 2002

Related U.S. Application Data

(62) Division of application No. 09/265,400, filed on Mar. 10, 1999.

(30) Foreign Application Priority Data

Mar. 12, 1998 (JP) .............................................. 10-61709

(51) Int. Cl.[7] ......................................... H01L 21/8238
(52) U.S. Cl. ..................................... 438/207; 438/219
(58) Field of Search ............................... 438/207, 219, 438/244, 298, 387, 396, 427, 450

(56) References Cited

U.S. PATENT DOCUMENTS

| | | | |
|---|---|---|---|
| 4,970,564 A | 11/1990 | Kimura et al. | |
| 5,365,095 A | 11/1994 | Shono et al. | |
| 5,457,064 A | 10/1995 | Lee | |
| 5,732,009 A * | 3/1998 | Tadaki et al. | 365/51 |
| 5,866,927 A * | 2/1999 | Cho et al. | 257/296 |
| 5,885,883 A * | 3/1999 | Park et al. | 438/435 |
| 6,326,657 B1 * | 12/2001 | Ohkawa | 257/296 |

FOREIGN PATENT DOCUMENTS

JP   7-273181   10/1995

* cited by examiner

*Primary Examiner*—Amir Zarabian
*Assistant Examiner*—Pamela E Perkins
(74) *Attorney, Agent, or Firm*—Westerman, Hattori, Daniels & Adrian, LLP

(57) ABSTRACT

A plurality of memory cell transistors are formed on a principal surface of a semiconductor substrate in a plurality of active regions defined by an isolation region. Each memory cell transistor uses one word line as its gate electrode and has a pair of source and drain regions defined by the gate electrode and the isolation region. One of a pair of source and drain regions is connected to one of a plurality of bit lines, and the other region is connected to one of a plurality of capacitors. Three sides of the other region are defined by the isolation region. The other region includes a first impurity doped region extending to under another word line adjacent to the one word line and a second impurity doped region partially overlapping the first impurity doped region and the gate electrode.

20 Claims, 16 Drawing Sheets

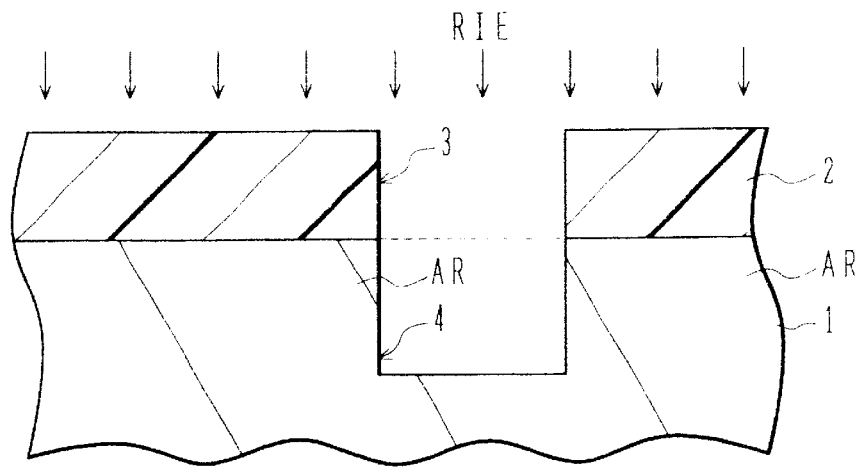
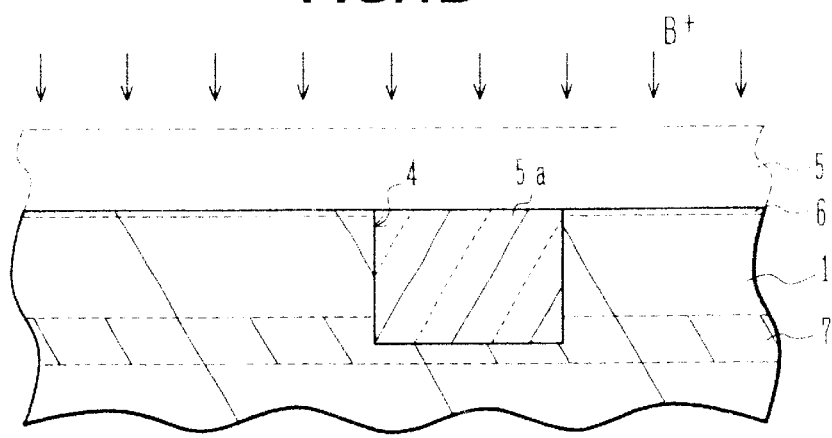
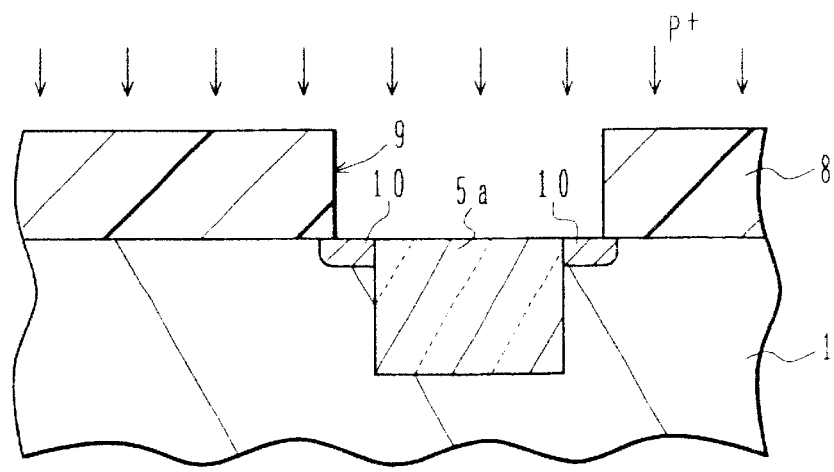

SEMICONDUCTOR MEMORY OF GOOD RETENTION AND ITS MANUFACTURE

This application is a division of prior application Ser. No. 09/265,400, filed Mar. 10, 1999.

This application is based on Japanese patent applications HEI 10-61709 filed on Mar. 12, 1998 and HEI 11-39079 filed on Feb. 17, 1999, the whole contents of which are incorporated herein by reference.

BACKGROUND OF THE INVENTION a) Field of the Invention

The present invention relates to a semiconductor device and its manufacture, and more particularly to a semiconductor device with memories of high integration and its manufacture.

b) Description of the Related Art

Still higher integration is required for semiconductor integrated circuit devices. Requirements of high integration is particularly strong in dynamic random access memory (DRAM) devices.

One memory cell of DRAM is generally constituted of one memory capacitor and one transistor. A transistor used is generally an insulated gate (IG) field effective transistor (FET) having a pair of source/drain regions, a channel coupling the source/drain regions, and an insulated gate electrode disposed above the channel for controlling the conductivity of the channel. The IG FET is typically a metal-oxide-semiconductor (MOS) FET.

A memory capacitor is connected to one hereinafter called a source, as a matter of convenience) of source/drain regions, and a bit line is connected to the other (hereinafter called a drain as a matter of convenience). A word line is connected to the insulated gate electrode. In order to realize high integration, it is desired to make memory cells of a fine pattern and dispose a plurality of bit lines and word lines at a narrow pitch. Various techniques have been proposed to dispose bit and word lines at a high density.

It is also desired that DRAM has excellent retention (storage) characteristics which show how long electric charges in the capacitor can be retained.

SUMMARY OF THE INVENTION

It is an object of the present invention to provide a semiconductor device having memory cells suitable for high integration and excellent in retention characteristics.

It is another object of the invention to provide a method of manufacturing such semiconductor devices.

According to one aspect of the present invention, there is provided a semiconductor device comprising: a semiconductor substrate having one principal surface and a first conductivity type surface area exposed to the principal surface; an element isolation insulating region formed on the principal surface of the semiconductor device and defining a plurality of active regions in the first conductivity type surface area; a gate insulating film formed on a partial surface of each of the plurality of active regions; a plurality of word lines each partially disposed on the gate insulating film on the principal surface and made of conductive material, each of the plurality of word lines extending in a first direction as a whole; a plurality of bit lines extending in a second direction as a whole intersecting with the first direction on the principal surface; a plurality of capacitors formed on the principal surface; and a plurality of memory cell transistors formed in the plurality of active regions, each memory cell using one word line as a gate electrode and having a pair of source and drain regions of a second conductivity type opposite to the first conductivity type, the source and drain regions being defined by the gate electrode and the element isolation insulating region, one of the pair of source and drain regions being connected to one of the plurality of bit lines, the other of the pair of source and drain regions being connected to one of the plurality of capacitors, three sides of an area of the other of the pair of source and drain regions being defined by the element isolation insulating region, and the other of the pair of source and drain regions including a first impurity doped region extending to a location under another word line adjacent to the one word line and a second impurity doped region partially overlapping the first impurity doped region and the gate electrode.

According to another aspect of the present invention, there is provided a method of manufacturing a semiconductor device, comprising the steps of: forming an element isolation insulating film on a principal surface of a first conductive type area of a semiconductor substrate, the element isolation insulating film defining an active region; selectively introducing impurities of a second conductivity type opposite to the first conductivity type into end portions of the active region to form first impurity doped regions; forming a gate insulating film on the active region; forming a word line made of conductive material on the gate insulating film, a pattern of the word line not overlapping the first impurity doped region, traversing the active region, and extending in one direction; introducing impurities of the second conductivity type into the active region by using the word line and the element isolation insulating film as a mask, to form second impurity doped regions at least partially overlapping the first impurity doped regions; and forming a capacitor connected to one of the second impurity doped regions and extending over the word line.

The region having the same conductivity type as that of the source/drain regions of a memory transistor is formed under the adjacent word line. Therefore, irrespective of any potential of the adjacent word line, it is possible to prevent generation of a depletion layer or an inversion layer so that deterioration of the retention characteristics to be caused by the potential of the adjacent word line can be reduced.

As above, the retention characteristics of a DRAM type memory cell can be improved.

BRIEF DESCRIPTION OF THE DRAWINGS

FIGS. 1A, 1B, 1C, 1D, 1E, 1F, 1G, 1H, and 1I are schematic cross sectional views of a semiconductor substrate illustrating a method of manufacturing a semiconductor device according to a first embodiment of the invention.

DETAILED DESCRIPTION OF THE PREFERRED EMBODIMENTS

Embodiments of the invention will be described with reference to the accompanying drawings, by taking as an example a DRAM device.

Figure 5A:
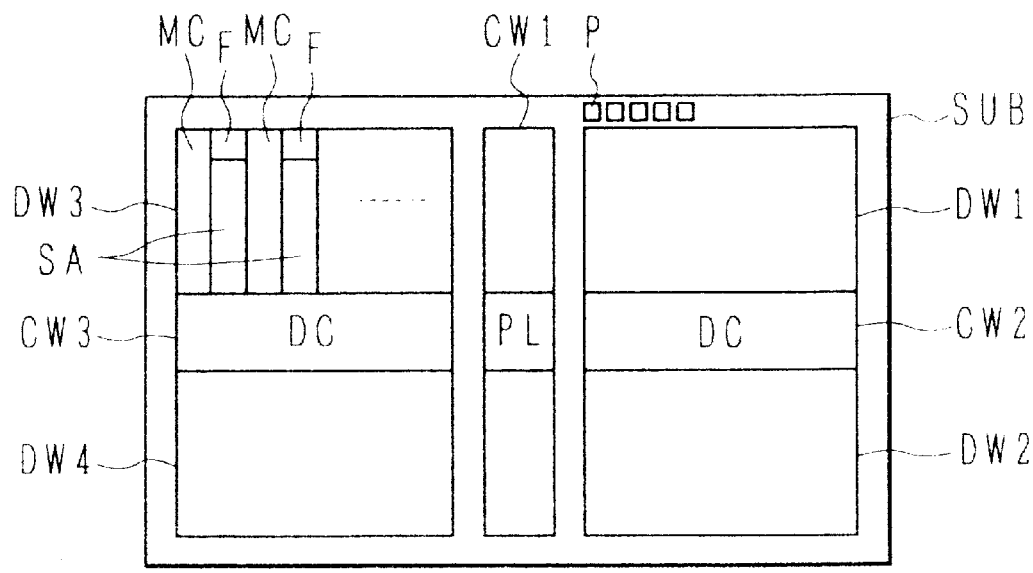
FIGS. 5A and 5B are a plan view and a partial schematic cross sectional view illustrating the overall structure of a DRAM device.

FIG. 5A shows an example of a layout of a DRAM chip. In the central area of a p-type silicon substrate SUB having a resistivity of, for example, 10 Ωcm, a complementary type well region CW1 is formed which includes p-type well(s) and n-type well(s) for forming peripheral circuit(s) therein. On both sides of the well region CW1, double-well regions DW1, DW2, DW3, and DW4 are formed. Between the double-well regions DW1 and DW2, a complementary type well region CW2 is formed for forming a decoder circuit DC therein. Similarly, between the double-well regions DW3 and DW4, a complementary type well region CW3 is formed for forming another decoder circuit DC therein. Each double-well region DW has memory cell regions MC, sense amplifier regions SA, and fuse regions F. The memory cell region MC has memory cells formed in a p-type well or wells in an n-type well. The sense amplifier region SA has sense amplifiers made of CMOS circuits formed in n- and p-type wells. The fuse region F has fuses formed on p-type wells in an n-type well. Pads P are formed in a peripheral area of the chip.

Figure 5B:
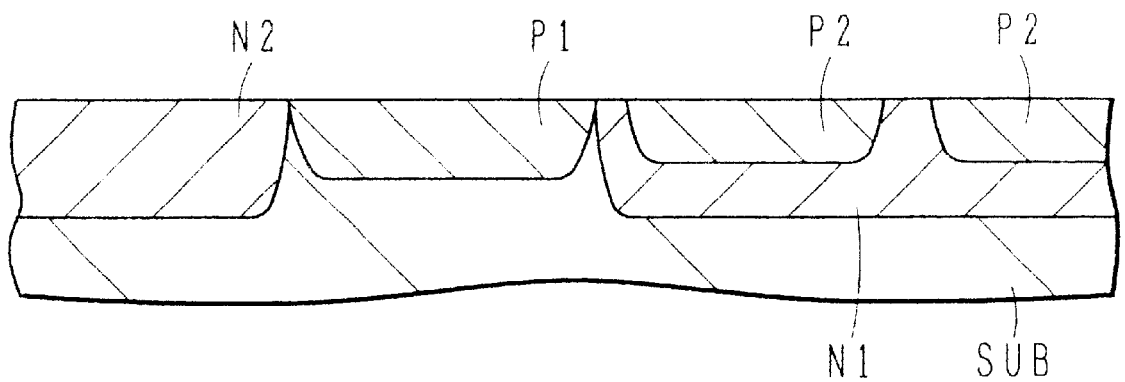

FIG. 5B shows an example of the structure of a semiconductor substrate realizing well structures described above. In one principal surface area of the p-type silicon substrate SUB, n-type wells N1 and N2 are formed having a conductivity type opposite to that of the substrate. A p-type well P1 may be formed in another area of the p-type substrate SUB. This well P1 is in a state electrically connected to the substrate SUB.

A plurality of p-type wells P2 are formed in the n-type well N1 to be electrically separated from the substrate SUB. The p-type wells P1 and P2 can be formed by the same processes. The p-type well P2 in the n-type well N1 is shallower than the p-type well P1 in the p-type substrate SUB, due to the impurity compensation for the impurity concentration of the n-type well N1.

The complementary type well CW shown in FIG. 5A can be formed by using the n-type well N2 and the P-type well P2 or P1. The double-well DW can be formed by using the n-type well N1 and the inner p-type well P2.

Such a well structure can be formed through ion implantation to be performed before or after an element isolating (separating) insulation region (e.g. thick oxide film) is formed. Although only a memory region is used by way of example in the following description, various regions such as shown in FIG. 7A are formed on the same chip.

As shown in FIG. 1A, on the surface of a silicon substrate 1 having a p-type surface region, a resist pattern 2 is formed having openings in an area where an element isolation (separation) insulating region is formed. By using the resist pattern 2 as a mask, the semiconductor substrate 1 is anisotropically etched to formed a trench 4 having a depth of, for example, 300 nm, through reactive ion etching (RIE) using, for example, $Cl_2$ and $O_2$ as etching gas. The trench has generally vertical side walls and surrounds an active region AR as will be later described. "Generally vertical" means an angle near a right angle, since it is very difficult to realize a perfect right angle by a semiconductor manufacture process. A generally vertical side wall provides similar effects to a perfect right angle side wall. After the reactive ion etching, the resist pattern 2 is removed.

The trench 2 may be formed by other processes. For example, after a thermal oxide film is grown on the silicon substrate, a silicon nitride film is grown on the thermal oxide film through chemical vapor deposition (CVD). The silicon nitride film and thermal oxide film are patterned by using a photoresist mask, and thereafter the silicon substrate is etched by using the patterned silicon nitride film and thermal oxide film as a mask. In this case, the silicon nitride film and the like also function as a stopper when chemical mechanical polishing (CMP) is executed and prevents the surface of the silicon substrate from being damaged.

As shown in FIG. 1B, on the surface of the semiconductor substrate 1, a silicon oxide film 5 is deposited. For example, the silicon oxide film 5 is formed through atmospheric pressure (1 atm) CVD using tetraethoxysilane (TEOS) and ozone or through plasma enhanced (PE) CVD using high density plasma.

After the silicon oxide film 5 is formed, CMP is performed to remove the silicon oxide film deposited on the surface of the semiconductor substrate 1 and expose the surface of the substrate 1. In this state, the surface of the silicon oxide region left in the trench 4 becomes flush with the nearby surface of the substrate 1.

In this manner, an element isolation region 5a is formed.

Figure 2A:
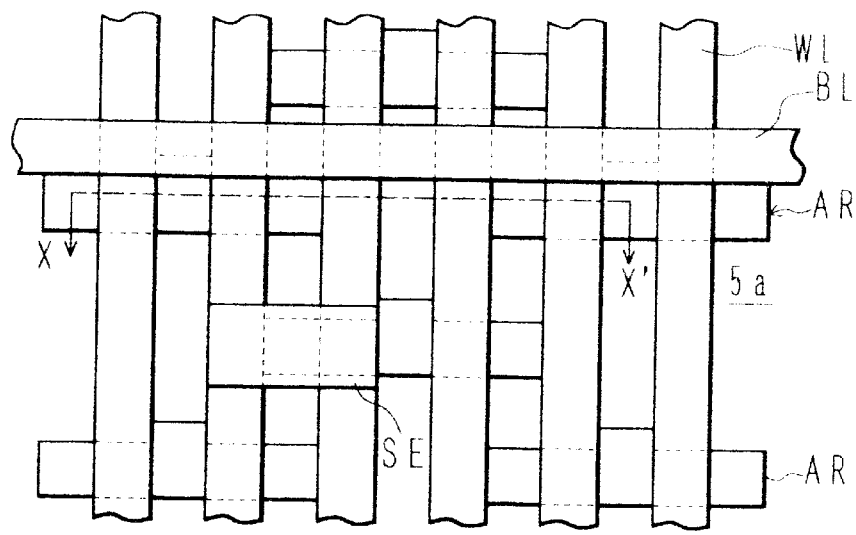
FIGS. 2A, 2B, and 2C are plan views and a partial cross sectional view further illustrating the embodiment shown in FIGS. 1A to 1I.

FIG. 2A is a schematic plan view showing a layout of active regions AR formed in the substrate and the element isolation insulating region 5a surrounding the active regions. A plurality of active regions AR are formed being separated by the element isolation insulating region 5a. On the surface of the substrate having the structure described above, MOS transistors, capacitor storage electrodes SE, bit lines BL, word lines WL, and the like are formed. In order to simplify the drawing, although a plurality of word lines WL are shown, only one bit line BL and one capacitor storage electrode SE are shown.

Reverting to FIG. 1B, after the element isolation insulating region 5a is formed, ions are implanted in order to prevent parasitic MOS transistors from being formed. For example, $B^+$ ions are implanted at an acceleration energy of 100 keV and a dose of about $2 \times 10^{12}$ $cm^{-2}$ to form a boron doped region 7. Boron ions implanted at the acceleration energy of 100 keV is distributed in the substrate, with a distribution center being set at a depth of about 300 nm. The threshold value of a parasitic MOS transistor is about 7 V.

If the element isolation insulating region 5a is to be formed deeper, the acceleration energy is increased. For example, if the element isolation insulating region 5a has a depth of 400 nm, the acceleration energy of boron ions is set to about 120 keV. In the following drawings, the deep ion doped region 7 is not shown in order to simplify the drawings.

Prior to the ion implantation process shown in FIG. 1B, a thin silicon oxide film 6 may be formed on the surface of the substrate 1. This silicon oxide film 6 functions to prevent surface roughening from being formed by ion implantation.

As shown in FIG. 1C, a resist pattern 8 is formed on the surface of the semiconductor substrate 1. The resist pattern 8 has an opening through which ions are implanted.

Figure 2B:
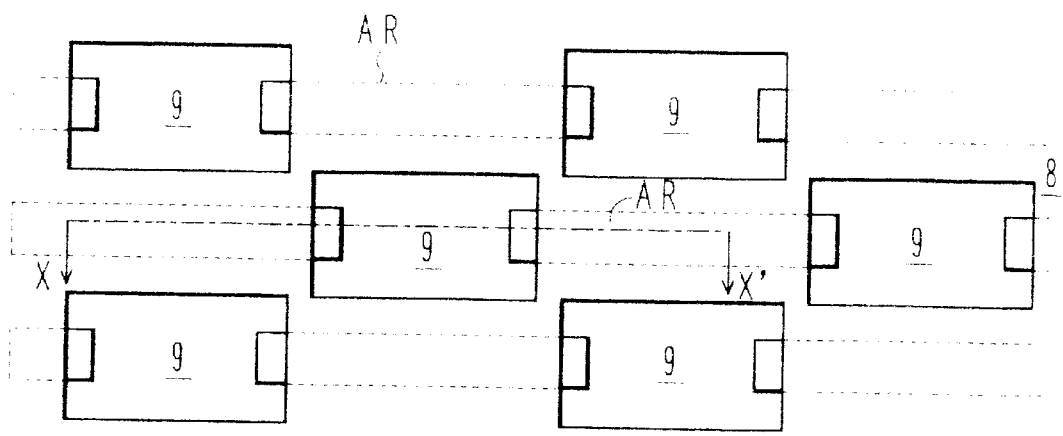

FIG. 2B is a schematic plan view of the resist pattern 8. The opening 9 formed in the resist pattern 8 exposes end portions of each active region AR.

As shown in FIG. 1C, by using the resist pattern 8 as a mask, $P^+$ ions are implanted into the semiconductor substrate 1 at an acceleration energy of 20 keV and a dose of about 1.5 to $2 \times 10^{13}$ cm$^{-2}$. With this ion implantation, an n-type region 10 is formed to a depth of about 0.14 to 0.2 $\mu$m. In this case, although $P^+$ ions are implanted also into the element isolation insulating region, these $P^+$ ions do not give any influence to the conductivity of the element isolation insulating region which therefore does not play any role in active operations of the semiconductor device.

$P^+$ ions are implanted only in a cell array and the other area is covered with the resist pattern 8. After this ion implantation, the resist pattern 8 is removed.

Figure 1D:
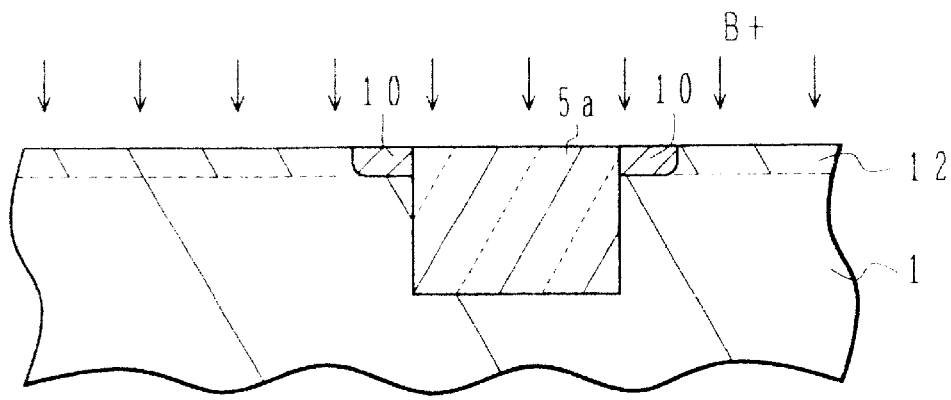

As shown in FIG. 1D, $B^+$ ions are implanted in the whole area of the cell array at an acceleration energy of 20 keV and a dose of about 1 to $1.5 \times 10^{13}$ cm$^{-2}$, to thereby adjust the threshold voltage Vth of MOS transistors to be formed in the cell array.

If the silicon oxide film 6 shown in FIG. 1B was formed, after the ion implantation shown in FIG. 1D, this silicon oxide film 6 is removed. The n-type region 10 has such an impurity concentration that its conductivity type is not inverted by this $B^+$ ion implantation.

When the step of FIG. 1D is done before the step of FIG. 1C, the ion implantation steps of FIGS. 1B and 1D can be performed using the same mask.

The number of masks can be reduced in this case.

Figure 1E:
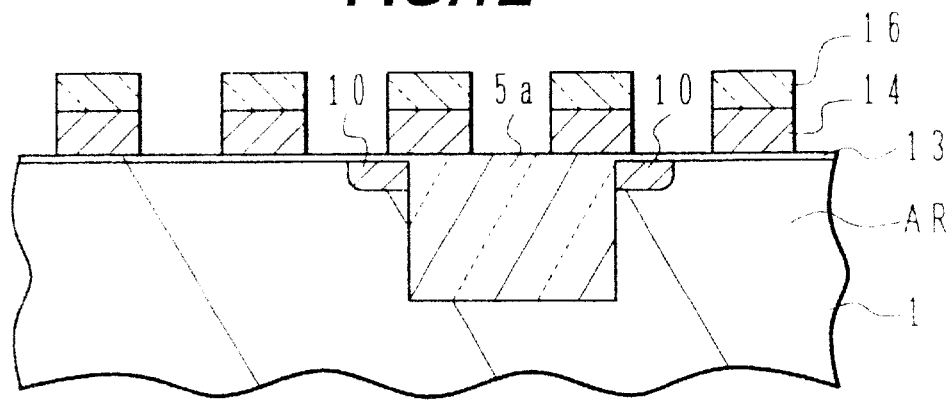

As shown in FIG. 1E, after the surface of the active region AR is cleaned, a gate oxide film 13 having a thickness of about 8 nm is formed on the surface of the active region AR through thermal oxidation at a temperature of about 850° C. in a wet atmosphere. After the surface of the active region AR is covered with the gate oxide film 13, a conductive layer 14 as a gate electrode (word line) and an insulating layer 16 are deposited on the whole surface of the substrate.

For example, the conductive layer 14 may be a doped polysilicon layer having a thickness of about 160 nm or a lamination layer of a doped polysilicon layer having a thickness of about 80 nm and a tungsten silicide (WSi) layer having a thickness of about 100 nm. The insulating layer 16 is, for example, a lamination layer of a silicon oxide layer having a thickness of 50 nm and a silicon nitride layer having a thickness of about 150 nm. The insulating layer formed on the conductive layer is made of material having a different etching rate from that of an interlayer insulating film to be formed on the gate structure.

A resist pattern is formed on the insulating layer 16, and the lamination of the insulating layer 16 and conductive layer 14 is patterned through anisotropic etching. In this manner, the word line structure is formed. Word lines each have a width of about 0.2 $\mu$m and are disposed at an interval of about 0.2 $\mu$m.

The word line structure formed on the element isolation insulating region 5a partially overlaps the active region AR. However, under the overlapped area, the n-type region 10 is disposed. After the word line structure is formed, the resist pattern used is removed.

Figure 1F:
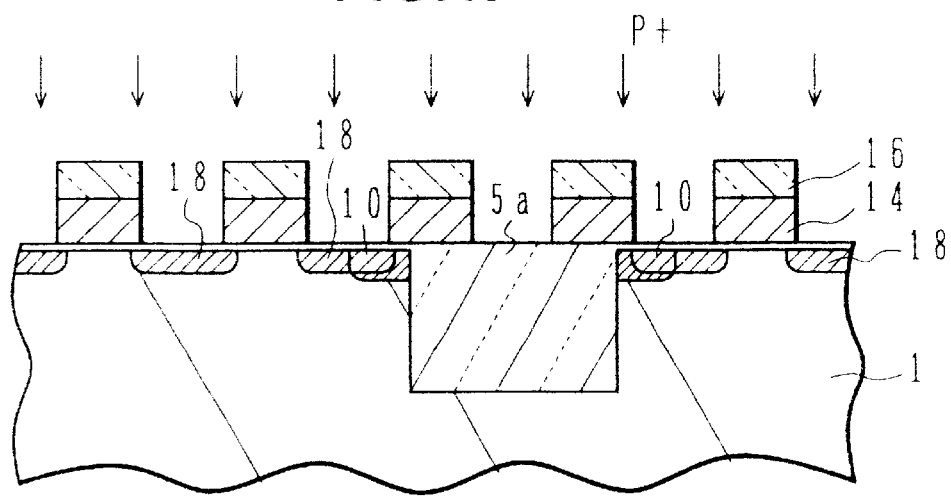

As shown in FIG. 1F, $P^+$ ions are implanted at an acceleration energy of about 30 keV and a dose of about $2 \times 10^{13}$ cm$^{-2}$ to thereby form an n-type region 18 in the active region exposed between adjacent word line structures. The n-type regions 18 partially creeping under the word line (gate electrode) constitute the source/drain region, and have an n-type impurity concentration higher than the n-type region 10. It is sufficient if the n-type region 10 has such an impurity concentration that the conductivity type thereof is not inverted into the p-type by the threshold value adjusting ion implantation process shown in FIG. 1D. The n-type region 10 and n-type region 18 are at least partially overlapped and form a continuous n-type region. The overlapped area is expected to have a higher impurity concentration than the other area of the n-type region 18. The overlapped area is also expected to be deeper than the other area of the n-type region 18.

Figure 1G:
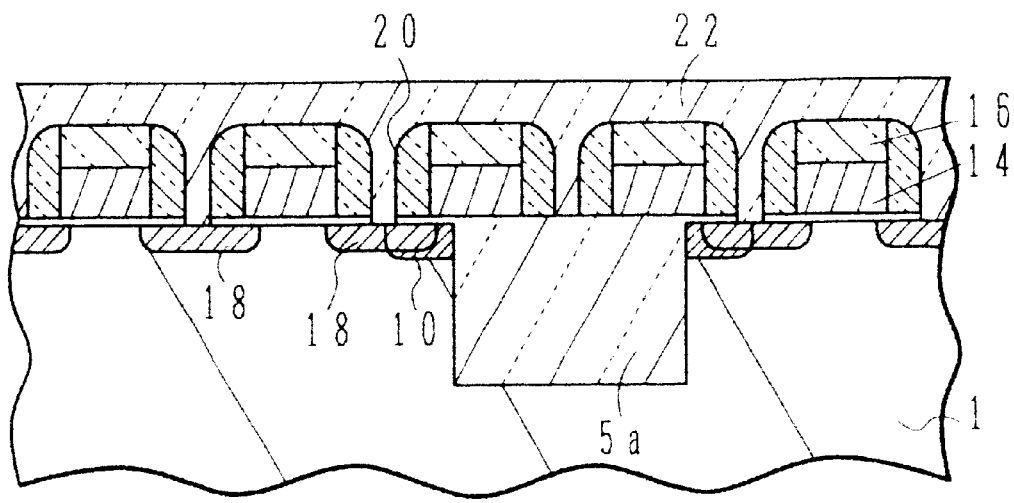

As shown in FIG. 1G, side wall insulating films 20 are formed on the side walls of the word line structure. For example, the side wall insulating film 20 is formed by the following processes. After the polysilicon surface of the conductive layer 14 is formed with a thermal oxide film having a thickness of about 3 nm through thermal oxidation at 800° C. in a dry oxygen atmosphere, a silicon nitride film is deposited to a thickness of about 80 nm by CVD. This thickness is at the flat surface of the word line structure and is slightly thinned on the side wall.

After the silicon nitride film is deposited, it is anisotropically etched through reactive ion etching using Ar+CHF$_3$+O$_2$ as etching gas to thereby leave the side wall insulating films 20. A borophosphosilicate glass (BPSG) film 22 is deposited over the whole surface of the substrate to a thickness of 200 to 250 nm. After the BPSG film 22 is deposited, a reflow process is performed to planarize the surface of the BPSG film 22.

Figure 1H:
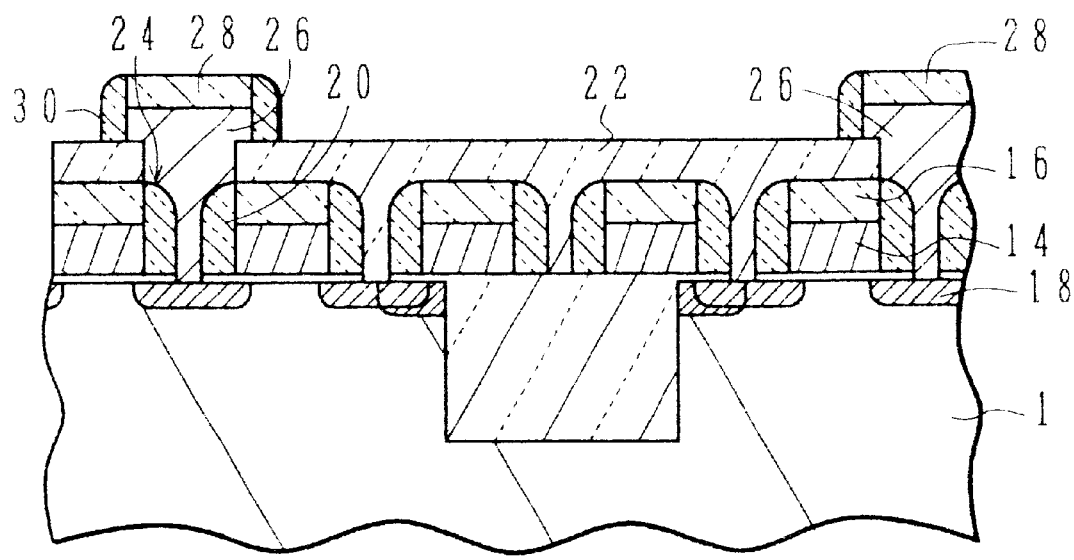

As shown in FIG. 1H, by using a resist pattern formed on the surface of the BPSG film 22 as a mask, an opening 24 for bit line contact is formed. During this etching process, the silicon nitride films covering the upper and side surfaces of the word line function as an etching stopper so that the opening 24 is formed in a self-alignment contact (SAC) manner. Thereafter, the resist pattern is removed, and a lamination of a conductive layer 26 and an insulating layer 28 is formed. The conductive layer 26 and insulating layer 28 have the same structures as those of the conductive layer 14 and insulating layer 16. Similar to forming the word line structure, by using a resist pattern, the insulating layer 28 and conductive layer 26 are patterned. Thereafter, a silicon nitride film is deposited and anisotropically etched to form bit line side wall insulating films 30. This bit line side wall insulating film 30 is formed by similar processes to those of forming the side wall insulating film 20 of the word line structure.

Figure 1I:
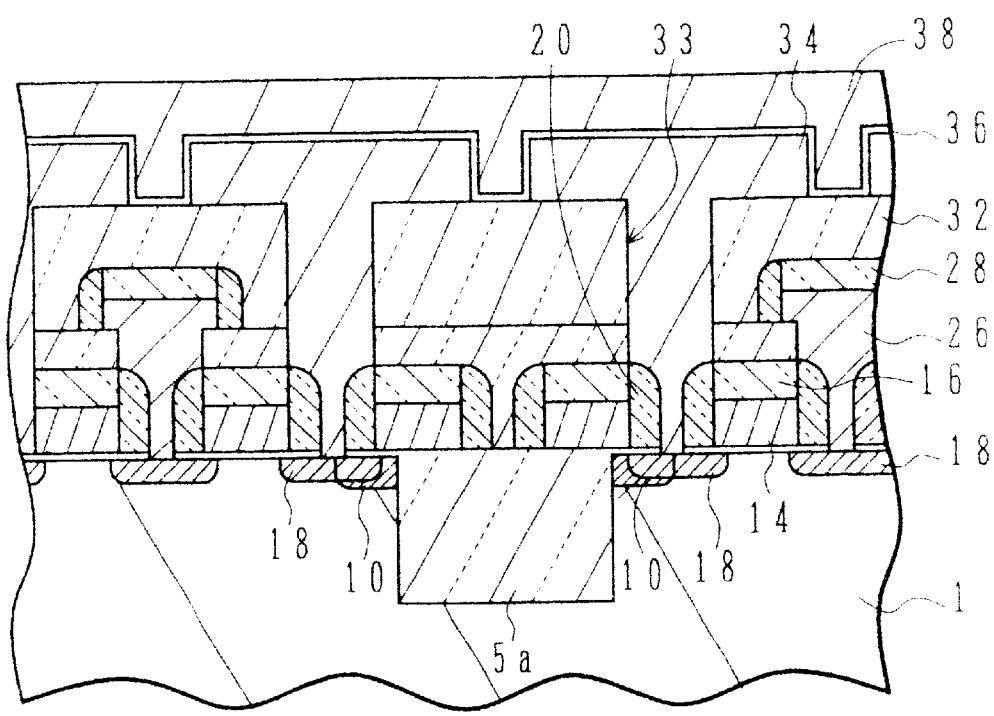

As shown in FIG. 1I, a BPSG film 32 is deposited to a thickness of about 250 nm, covering the bit line structure, and thereafter a reflow process is executed to planarize the surface of the BPSG film. A resist pattern is formed on the BPSG film 32 and a capacitor contact hole 33 is formed. The capacitor contact hole 33 is self-aligned with the word line side wall insulating films 20 and exposes the source/drain region not connected to the bit line. After the opening 33 is formed, a polysilicon layer, for example, is deposited to fill the opening 33 with it and form a silicon film 34 extending on the BPSG film 32. The silicon film 34 is patterned to form capacitor storage electrodes 34, each being electrically separated.

Thereafter, a silicon nitride film having a thickness of about 4 nm is deposited to cover the surface of the storage electrode 34 with it. The substrate surface is oxidized at about 800° C. in a wet oxygen atmosphere to thereby oxidize the surface of the silicon nitride layer by about 1 nm thick. In this manner, a capacitor dielectric film 36 is formed. The thermal oxidation of the surface of the silicon nitride film improves the capacitor charge retention characteristics and the capacitor insulating characteristics. After the capacitor dielectric film 36 is formed, another silicon film is formed covering the whole surface of the cell array to thereby form an opposing electrode 38. The opposing electrode in the area different from the cell array is removed.

In the above embodiment, after the word line structure is formed, ions are implanted and thereafter the side wall insulating films are formed. The side wall insulating films may not be formed. However, in another area of the same semiconductor chip, generally MOS transistors having the LDD structure are formed. In this case, it is necessary to form side wall insulating films on the gate electrode in order to form MOS transistors with the LDD structure. If these processes are used in common, the side wall insulating films are also formed on the side of memory cell transistors.

Figure 2C:
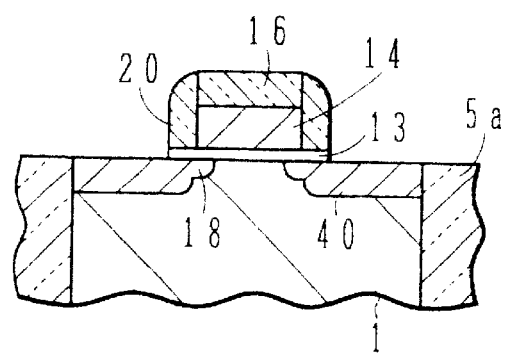

FIG. 2C is a schematic diagram showing the structure of a MOS transistor having the LDD structure used in an area different from the memory cell area. The gate electrode structure is made of the conductive layer 14 and insulating layer 16, and the n-type regions 18 of a low impurity concentration are formed by the ion implantation process shown in FIG. 1F. Thereafter, the side wall insulating film 20 is formed, and then n-type impurity ions are implanted at a high concentration to form the source/drain regions 40 having a low resistivity. The other structures are the same as those of a MOS transistor in the memory cell area.

In the above embodiment, between the source/drain region connected to the capacitor and the element isolation insulating region, the n-type region 10 having a conductivity type same as the source/drain region 18 is formed by the ion implantation process shown in FIG. 1C. The function of this n-type region 10 will be described with reference to FIGS. 3A and 3B.

Figure 3A:
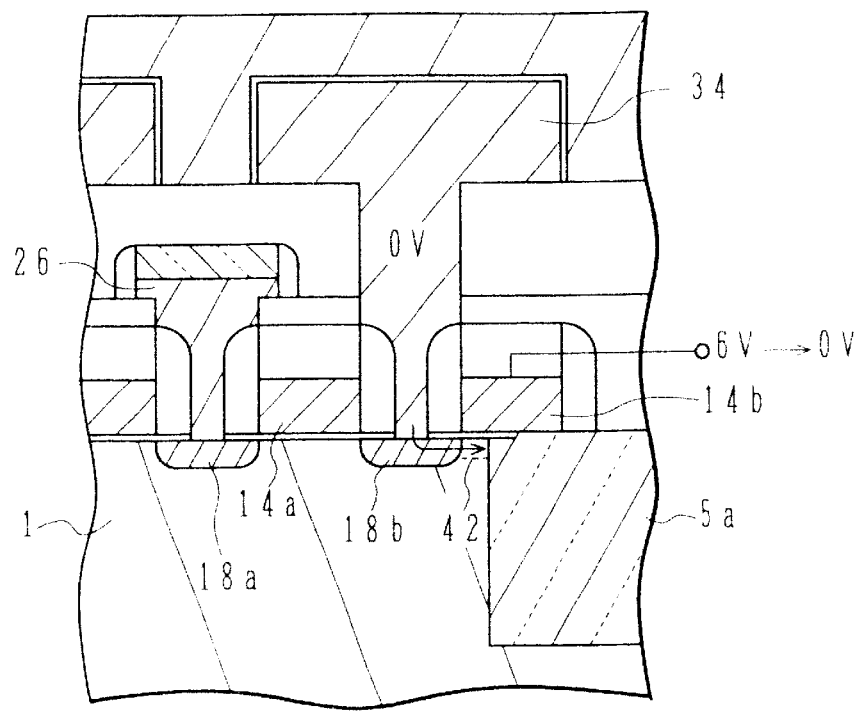
FIGS. 3A and 3B are schematic cross sectional views of a semiconductor substrate explaining the effects of the embodiment shown in FIGS. 1A to 1I and FIGS. 2A to 2C.
Figure 3B:
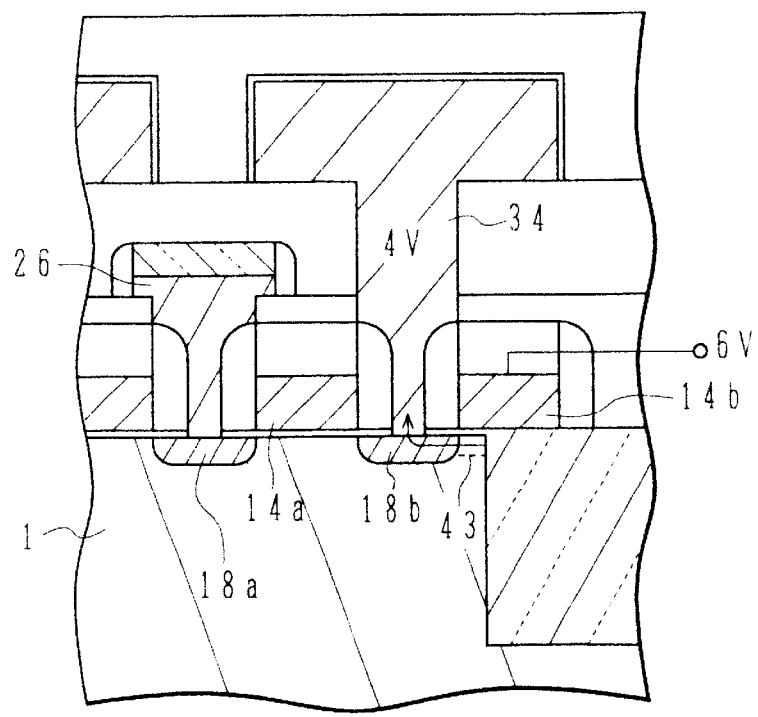

The structure shown in FIGS. 3A and 3B omits the n-type region 10 for inversion prevention in the structure shown in FIG. 1I. The source/drain (drain) region connected to the bit line 26 is represented by 18$a$, and the source/drain (source) connected to the capacitor storage electrode 34 is represented by 18$b$. The gate electrode between the source/drain regions 18$a$ and 18$b$ is represented by 14$a$, and the adjacent word line is represented by 14$b$.

In the state shown in FIG. 3A, 0 V representative of "0" is stored in the storage electrode 34. When an on-signal of 6 V is applied to the adjacent word line 14$b$, the surface layer of the p-type region 1 under the adjacent word line 14$b$ is inverted to form an n-type inversion region 42. Therefore, electrons in the storage electrode 34 and n-type source region 18$b$ are also distributed into the n-type inversion region 42.

Under this state, when the voltage on the adjacent word line 14$b$ changes from 6 V representative of "on" to 0 V representative of "off", the inversion region 42 disappears. Although some electrons distributed in the inversion region 42 are returned to the n-type source region 18$b$, some other electrons are left in the p-type region, captured by trapping centers at an interface between silicon and a silicon oxide film, and recombined with holes to extinguish.

This phenomenon means a reduction of electrons stored in the storage electrode 34 and a rise of the potential of the storage electrode 34. This means therefore a possibility that the memory cell storing "0" changes to store "1". This phenomenon may be dependent upon the number of on/off changes of the adjacent word line.

In the state shown in FIG. 3B, 4 V representative of "1" is stored in the storage electrode 34. When an on-signal of 6 V is applied to the adjacent word line 14$b$, even if the surface layer of the p-type region 1 under the adjacent word line 14$b$ is not inverted, a depletion layer 43 is formed. If an inversion layer is formed, a depletion layer is formed under the inversion layer. If electrons are generated in the depletion layer 43, they are accelerated by an electric field of the depletion layer and may enter the storage electrode 34 storing 4V and the source region 18$b$. An increase in the number of electrons in the storage electrode 34 means a lowered storage potential. Namely, the memory cell storing "1" changes to store "0". This electron flow may be dependent upon the time length while an on-signal is applied to the adjacent word line 14$b$.

Memory cells having p-type regions under adjacent word lines were formed and the dynamic retention characteristics were measured by turning on and off the potential of the adjacent word lines. The experimental results supported the above assumptions.

The storage information destruction phenomenon of the memory shown in FIGS. 3A and 3B results from the formation of an inversion layer or a depletion layer under the adjacent word line. If an n-type region is formed under the adjacent word line, the n-type region is always present under the adjacent word line, irrespective of any potential of the adjacent word line. It is therefore expected that the memory destruction phenomenon resulting from the formation of an inversion layer and/or a depletion layer is suppressed.

In the above embodiment, in order to implant ions into the inversion preventive region, the process shown in FIG. 1C is necessary which uses one mask. This process may be shared with another process to be used for other purposes.

Figure 4A:
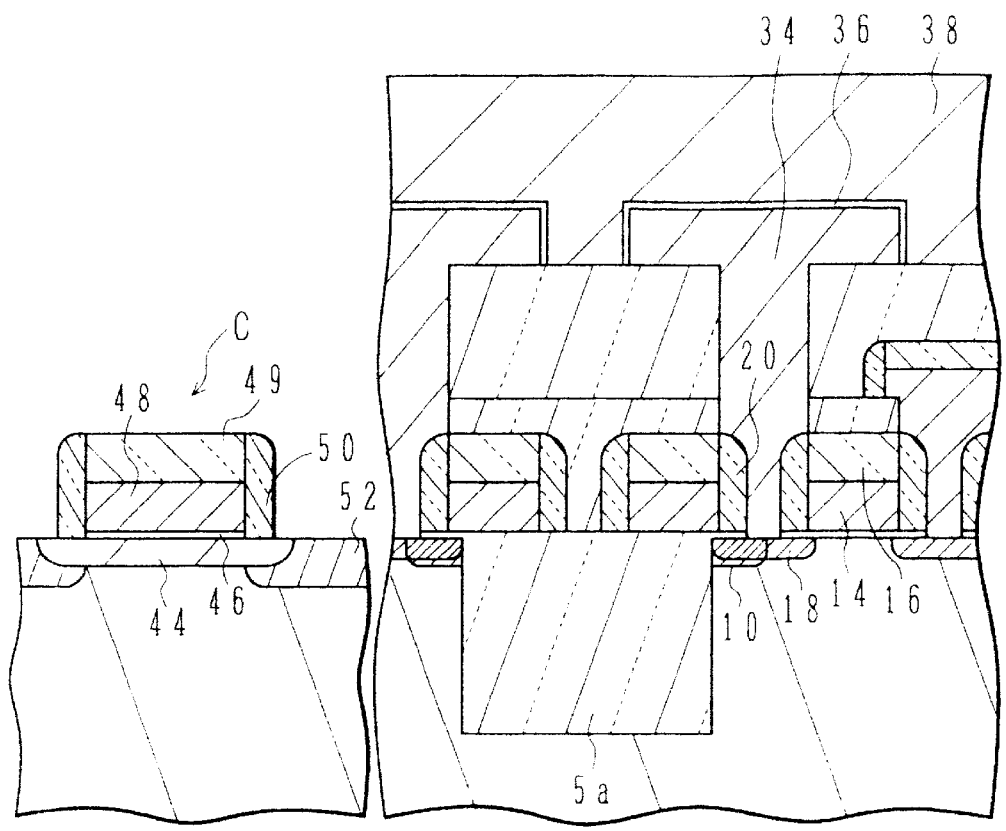
FIGS. 4A, 4B, and 4C are a cross sectional view and circuit diagrams illustrating the structure of the peripheral circuit of the semiconductor device shown in FIGS. 1A to 1I and FIGS. 2A to 2C.

FIG. 4A is a cross sectional view of a semiconductor substrate in which ions are implanted into the capacitor electrode at the same time when the inversion preventive region is formed.

In FIG. 4A, a memory area is shown right and the peripheral area other than the memory area is shown left. The memory cell area is formed by similar processes to the above embodiment. An n-type region 44 is formed at the same time when the process shown in FIG. 1C is executed. The n-type region 44 constitutes a lower electrode of a capacitor. A silicon oxide film 46 is formed at the same time when the gate oxide film 13 shown in FIG. 1E is formed, and constitutes a dielectric film of the capacitor. A conductive film 48 is formed at the same time when the conductive layer 14 shown in FIG. 1E is formed, and constitutes an upper electrode of the capacitor.

Insulating films 49 and 50 are formed at the same time when the insulating film 16 shown in FIG. 1E and the insulating film 20 shown in FIG. 1G are formed. High impurity concentration n-type regions 52 are formed at the same time when the source/drain regions of a high impurity concentration of LDD MOS transistors in the peripheral area shown in FIG. 2C are formed.

By using these processes, a MOS capacitor can be formed in the peripheral area. This MOS capacitor has characteristics better than a MOS capacitor which uses the substrate as one electrode thereof, because an impurity concentration in the semiconductor substrate used as one capacitor electrode can be increased.

Figure 4B:
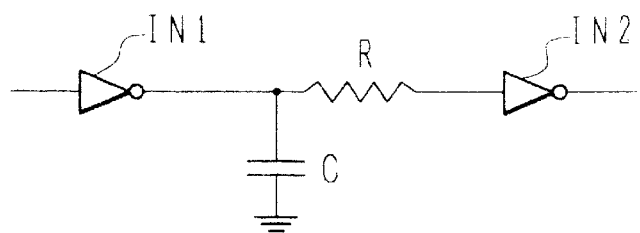

FIG. 4B illustrates an application of the MOS capacitor formed by the above processes. A delay circuit made of a resistor R and a capacitor C is connected between inverters IN1 and IN2. A signal input to the inverter IN1 is delayed by a predetermined time by the delay circuit having a time constant of CR, and output from the inverter IN2.

Figure 4C:
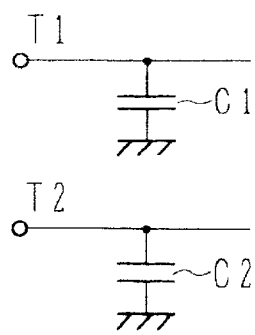

FIG. 4C illustrates another application of the MOS capacitor. Terminals T1 and T2 are used, for example, for externally receiving power source voltages. If pulsating external noises are input to the terminals T1 and T2, these external noises are absorbed by capacitors C1 and C2 so that the noises are suppressed or reduced.

Such MOS capacitors are also used as capacitive elements of a word line voltage booster circuit or the like, capacitive elements of analog circuits, and the like.

In the above embodiment, the element isolation insulating region is made of an insulating film filled in a trench. The element isolation insulating region may be realized by different structures.

Figure 6A:
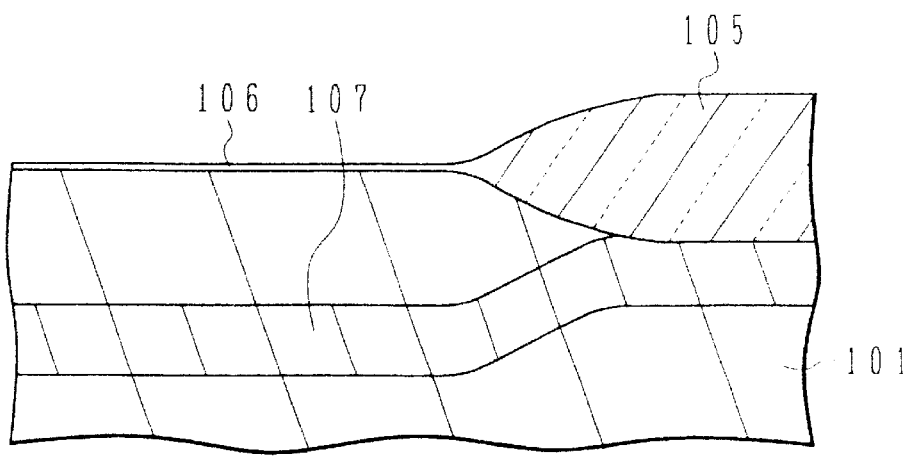
FIGS. 6A, 6B, and 6C are schematic cross sectional views of a semiconductor device illustrating a method of manufacturing a semiconductor device according to another embodiment of the invention.
Figure 6B:
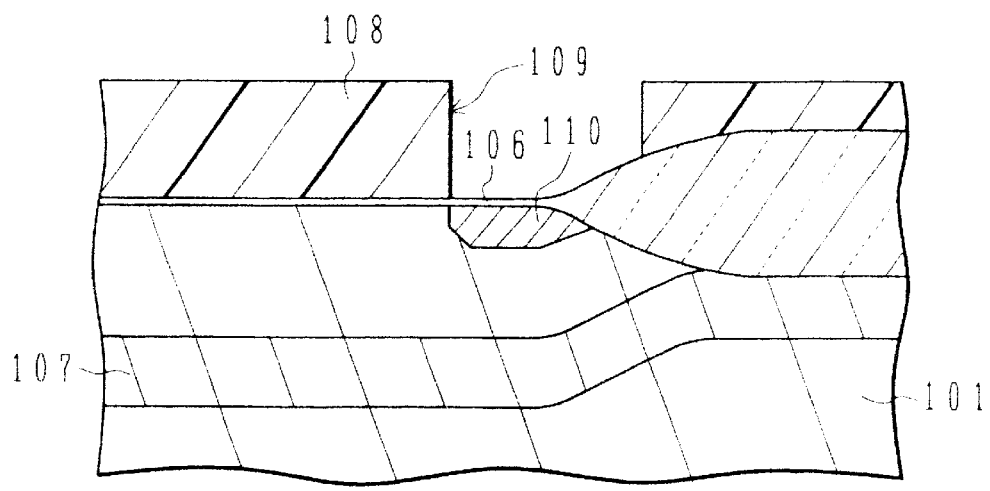
Figure 6C:
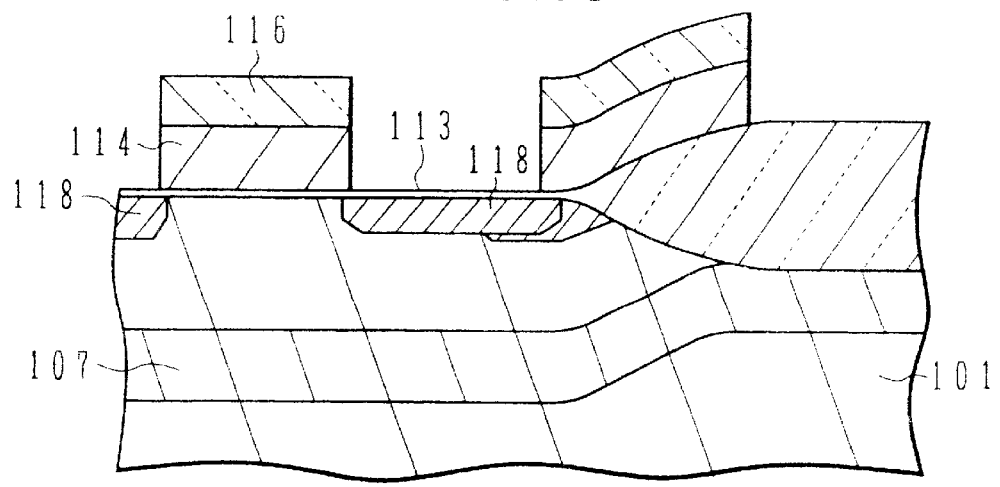

FIGS. 6A, 6B, and 6C illustrate another embodiment in which an element isolation insulating region is made of a field oxide film formed through LOCOS (local oxidation of silicon). On a p-type semiconductor substrate 101, a silicon nitride film as an oxidation-resistant film is formed, with a buffer oxide film being interposed therebetween. The silicon nitride film is patterned to define oxidation regions. The substrate is thermally oxidized at 1100° C. in an oxidizing atmosphere to form a field oxide film 105 having a thickness of about 350 nm.

After the silicon nitride film and buffer oxide film are removed, a silicon oxide film 106 is formed on the active region through thermal oxidation at 900° C. in a dry oxygen atmosphere.

In this state, B$^+$ ions are implanted at an acceleration energy of 100 keV and a dose of $2\times10^{12}$ cm$^{-2}$ to form a p-type ion doped region 107 for preventing parasitic MOS transistors from being formed. The threshold value of a parasitic MOS transistor is about 7V. The p-type region 107 distributes at the depth near the bottom surface of the field oxide film 105. However, it distributes deeper in the substrate 101 away from the bottom surface of the oxide film 105 at the bird's beak portion where the oxide film thickness is reduced.

As shown in FIG. 6B, a resist film is coated on the semiconductor substrate, and with exposure and development, a resist pattern 108 is formed. This resist pattern has an opening 109 in an area corresponding to each inversion preventing region to be formed.

By using the resist pattern 108 as a mask, P$^+$ ions are implanted at an acceleration energy of 40 keV and a dose of about $1.5\times10^{13}$ cm$^{-2}$ to form an n-type region 110. The acceleration energy of P$^+$ ions is set higher than that used in FIG. 1C in order to form the inversion preventive region also under the birds's beak. Thereafter, the resist pattern 108 is removed.

Ions are implanted in the whole area of the memory cell array to adjust the threshold value. For example, B$^+$ ions are implanted at an acceleration energy of 20 keV and a dose of $1\times10^{13}$ cm$^{-2}$.

The n-type region 110 functioning as an inversion preventive region has an impurity concentration sufficient for maintaining the n-type conductivity even under succeeding ion implantation. The silicon oxide film 106 on the active region is thereafter removed.

As shown in FIG. 6C, heat treatment is performed at 850° C. in a wet oxidizing atmosphere to form a gate oxide film 113 having a thickness of about 8 nm on the surface of the active region. A polysilicon layer 114 is formed by CVD over the whole surface of the substrate to a thickness of about 160 nm, the layer 114 covering the gate oxide film 113. On the polysilicon layer 114, a silicon oxide layer is formed by CVD to a thickness of about 50 nm and thereafter a silicon nitride film is formed by CVD to a thickness of about 150 nm. The silicon oxide film and silicon nitride film constitute an insulating film 116.

A resist pattern is formed on the insulating film 116, and the insulating film 116 and conductive layer 114 are anisotropically etched to form a gate electrode structure. By using this gate electrode structure as a mask, P$^+$ ions are implanted at an acceleration energy of 30 keV and a dose of $2\times10^{13}$ cm$^{-2}$ to form n-type source/drain regions 118.

The state shown in FIG. 6C corresponds to the state shown in FIG. 1F. Thereafter, processes similar to those illustrated in FIGS. 1G, 1H, and 1I are executed to complete a DRAM semiconductor device.

In this embodiment, an active region AR having a rectangular plan shape such as shown in FIGS. 2A and 2B is used. The shape of the active region AR is not limited only thereto. The present inventors have proposed a DRAM semiconductor device (U.S. Pat. No. 5,014,013) capable of maintaining a stable threshold value of each transistor even under a pattern misalignment, by devising the layout of the active region and word line of each memory cell, the whole contents of which are incorporated herein by reference.

Figure 7:
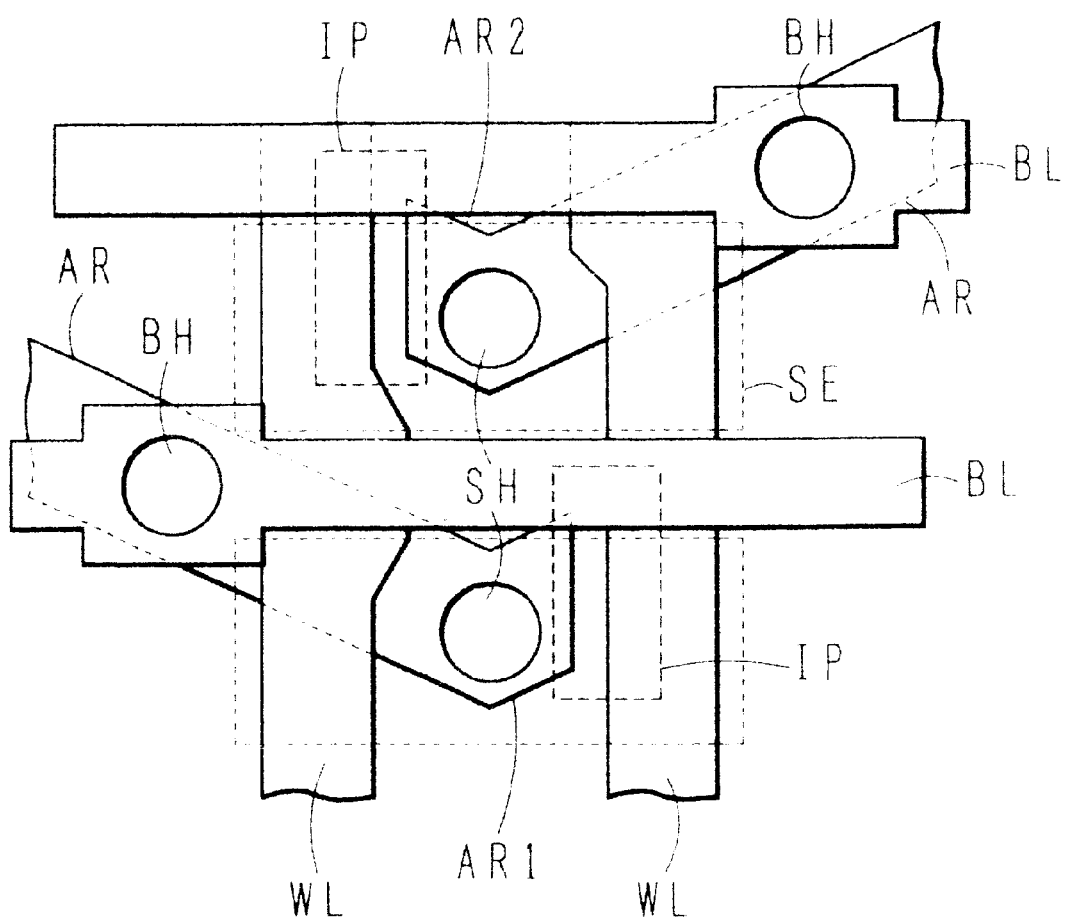
FIG. 7 is a schematic plan view showing a semiconductor substrate illustrating another embodiment of the invention.

The inversion preventive region of the embodiment may be applied to a DRAM semiconductor device having the above-proposed layout. As shown in FIG. 7, an active region AR is formed obliquely relative to a bit line BL, and has bent portions at opposite ends thereof. The righthand and lefthand portions of the bit contact holes BH are shown in different active regions AR in FIG. 7. The bent regions AR1 and AR2 are continuous with the active region AR at its opposite ends. Ion implantation for inversion prevention is performed to a region IP overlapping the bent regions AR1 and AR2. The element isolation insulating region surrounding the active regions AR (inclusive of regions AR1 and AR2) may be made of either the trench separation region such as shown in FIG. 1B or the LOCOS element isolation insulating region such as shown in FIG. 6A. The acceleration energy of ions for inversion prevention is set to that described with the above embodiments.

In the above embodiments, the inversion preventive region of the conductivity type same as that of the source/drain regions is used. The inversion preventive region may be made of a region having a conductivity type opposite to that of the source/drain regions to make the threshold voltage Vt under the adjacent word line WL much higher than the applied voltage to the word line WL. For example, in the process shown in FIG. 1C, boron ions instead of phosphorous ions may be implanted.

Various types of semiconductor elements as well as memory cells are formed in DRAM as shown in FIG. 5A The processes of manufacturing memory cells of n-channel MOS transistors and n-channel MOS transistors in a peripheral circuit will be described.

Figure 8A:
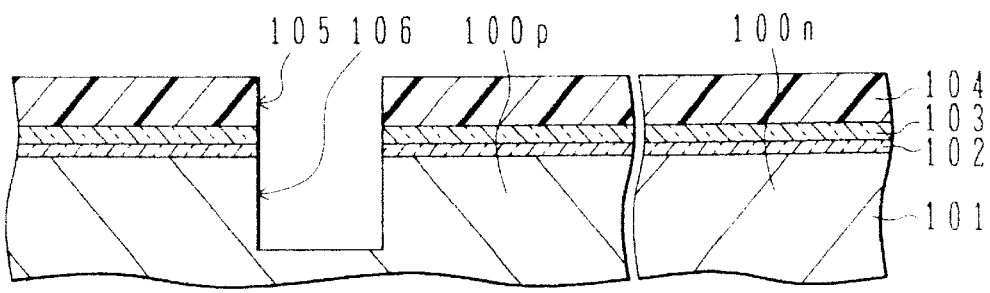
FIGS. 8A, 8B, 8C, 8D, 8E, 8F, 8G, 8H, 8I, 8J, and 8K are schematic cross sectional views of a semiconductor substrate illustrating another embodiment of the invention.

As shown in FIG. 8A, on the surface of a silicon substrate 101 having a p-type well 100$p$ and an n-type well 100$n$, a silicon oxide film 102 is formed to a thickness of 10 nm, for example, through thermal oxidation. A silicon nitride film 103 is formed thereon, for example by CVD to a thickness of about 150 nm. On the surface of the silicon nitride film 103, a resist pattern 104 is formed having an opening 105 in an area corresponding to a trench to be formed. By using the resist pattern 104 as a mask, the silicon nitride film 103 and silicon oxide film 102 are etched, and thereafter the silicon substrate 101 is also etched to a depth of about 380 nm. A trench 106 having a depth of about 380 nm is therefore formed in the surface layer of the silicon substrate 101. Thereafter, the resist pattern 104 is removed.

Figure 8B:
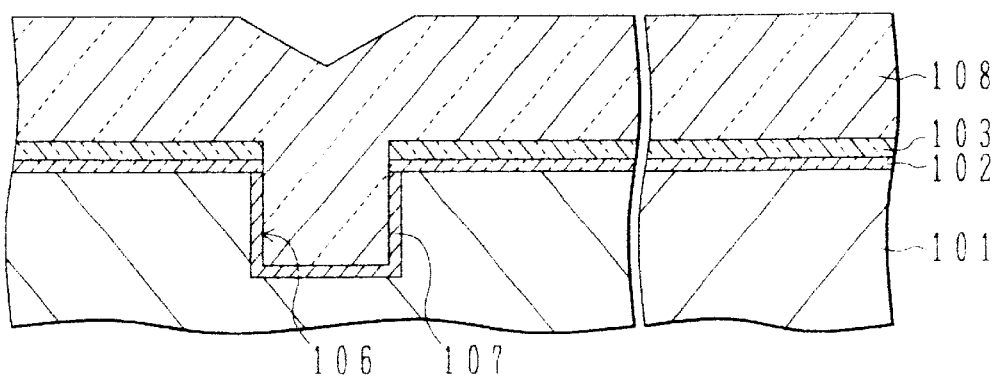

As shown in FIG. 8B, thermal oxidation is performed, for example, at 900° C. in an oxidizing atmosphere to form a silicon oxide film 107 on the surface of the trench 106 to a thickness of about 10 nm.

Next, for example, through high density plasma (HDP) CVD, an HDP silicon oxide film 108 is deposited on the surface of the substrate 101 to a thickness of about 750 nm. This silicon oxide film 108 completely fills the trench 106 covered with the thermal oxide film 107.

Figure 8C:
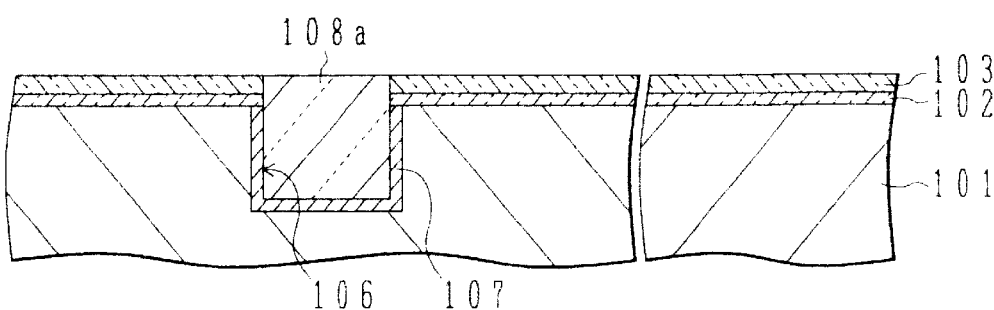

As shown in FIG. 8C, the silicon oxide film 108 is polished from the surface thereof through CMP to expose the surface of the silicon nitride film 103. The silicon nitride film 103 functions as a stopper for CMP. A silicon oxide film 108a filled in the trench 106 is flush with the surface of the silicon nitride film 103.

Figure 8D:
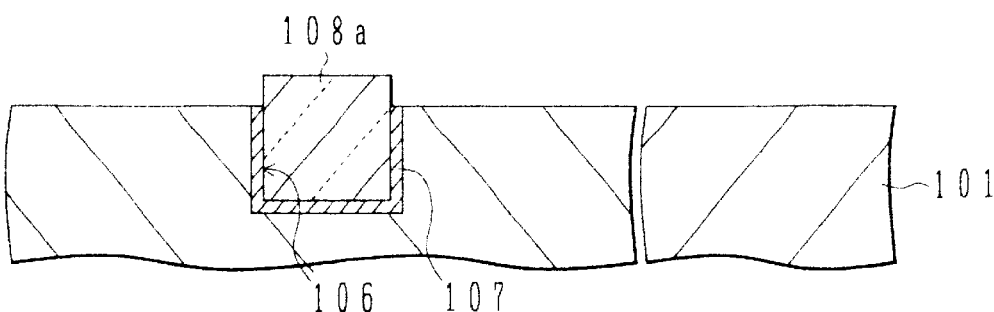

As shown in FIG. 8D, after CMP, the silicon nitride film on the surface of the substrate 101 is removed with hot phosphoric acid, and the underlying silicon oxide film 102 is removed with diluted hydrofluoric acid.

Figure 8E:
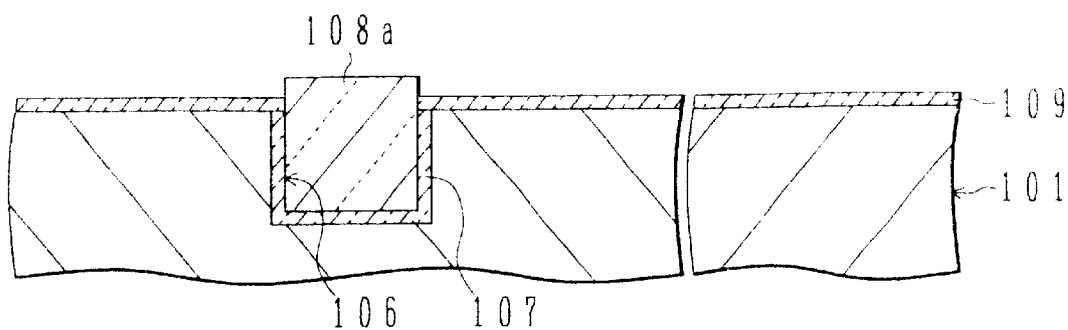

As shown in FIG. 8E, thermal oxidation is performed, for example, at 900° C. in an oxidizing atmosphere to form a silicon oxide film 109 to a thickness of about 10 nm on the surface of the semiconductor substrate.

Figure 8F:
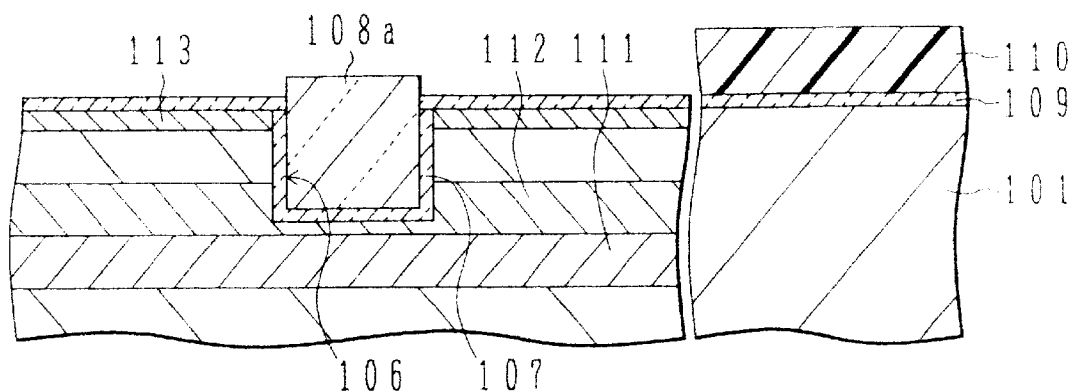

As shown in FIG. 8F, a resist pattern 110 is formed in an area where p-channel MOS transistors of the peripheral circuit are formed, to expose only the memory cell area. Three types of ion implantations are performed relative to the memory cell area. P$^+$ n-type impurity ions are implanted at an acceleration energy of 800 keV and a dose of $1.5 \times 10^{13}$ cm$^{-2}$ to form a buried n-type layer 111. B$^+$ p-type impurity ions are implanted under the conditions of an acceleration energy of 150 keV and a dose of $1 \times 10^{13}$ cm$^{-2}$ and under the conditions of an acceleration energy of 100 keV and a dose of $2 \times 10^{12}$ cm$^{-2}$ to form a buried p-type well 112. B$^+$ p-type impurity ions are implanted at an acceleration energy of 18 keV and a dose of $1.5 \times 10^{13}$ cm$^{-2}$ to form a surface layer 113 in the memory cell area with the controlled threshold value Vt. Thereafter, the resist pattern 110 is removed.

Figure 8G:
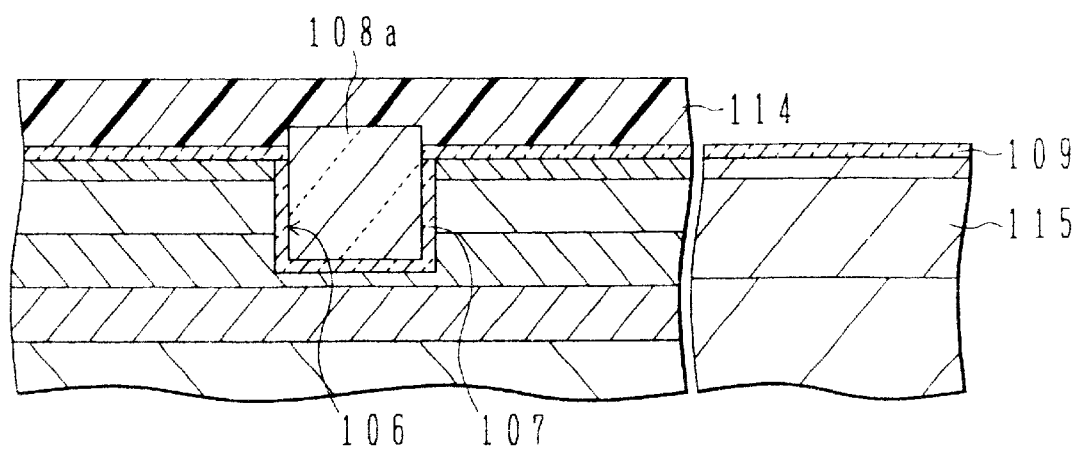

As shown in FIG. 8G, a resist pattern 114 covering the memory cell area is formed to expose only the p-channel MOS transistor area. By using the resist pattern 114 as a mask, P$^+$ n-type impurity ions are implanted under the conditions of an acceleration energy of 600 keV and a dose of $3 \times 10^{13}$ cm$^{-2}$ and under the conditions of an acceleration energy of 80 keV and a dose of $1.5 \times 10^{13}$ cm$^{-2}$ to form a buried n-type well 115. Thereafter, the resist pattern 114 is removed.

Figure 8H:
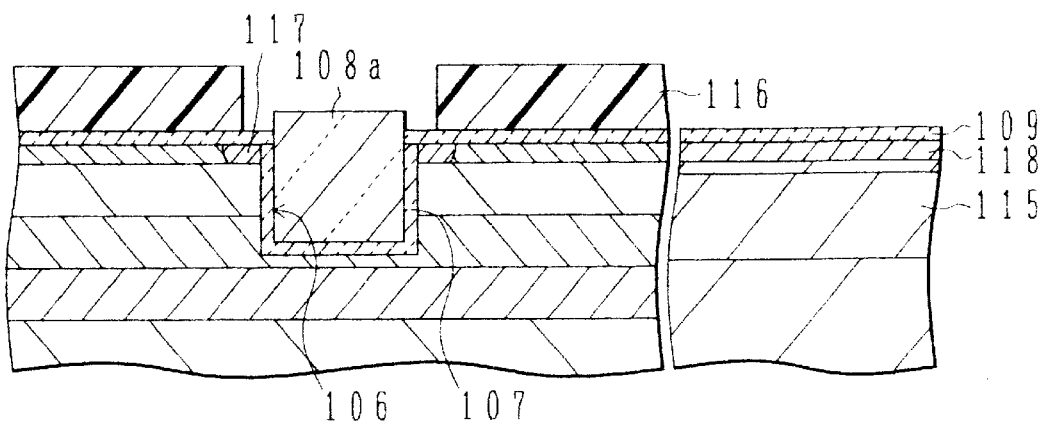

As shown in FIG. 8H, a resist pattern 116 is formed having an opening in an area corresponding to a peripheral area of the trench 106 and the p-channel MOS transistor area. By using this resist pattern 116 as a mask, P$^+$ n-type impurity ions are implanted at an acceleration energy of 20 keV and a dose of $1.5 \times 10^{13}$ cm$^{-2}$ to form an n-type region 117 in the peripheral area of the trench 106 and an n-type surface layer 118 in the p-channel MOS transistor area. Thereafter, the resist pattern 116 is removed.

Figure 8I:
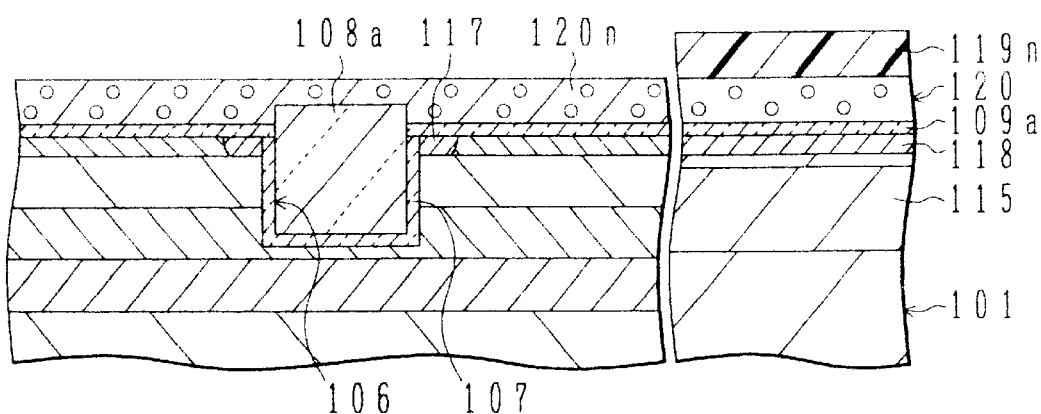

As shown in FIG. 8I, it is preferable to remove the silicon oxide film 109 and form a new gate oxide film 109a through thermal oxidation. A polysilicon layer 120 is deposited by CVD on the gate oxide film 109a. On the polysilicon layer 120, a resist pattern 119n is formed covering the p-channel MOS transistor area. By using the resist pattern 119n as a mask, P$^+$ n-type impurity ions are implanted into the polysilicon layer 120 at an acceleration energy of 20 keV and a dose of $1 \times 10^{16}$ cm$^{-2}$ to form an n-type polysilicon layer 120n. Thereafter, the resist pattern 119n is removed.

The buried silicon oxide film 108a slightly protrudes above the surface of the silicon oxide film 109a on the flat surface of the substrate. The protruded portion of the buried silicon oxide film 108a in the trench may be polished to planarize it through CMP or the like, prior to forming the polysilicon layer.

Figure 8J:
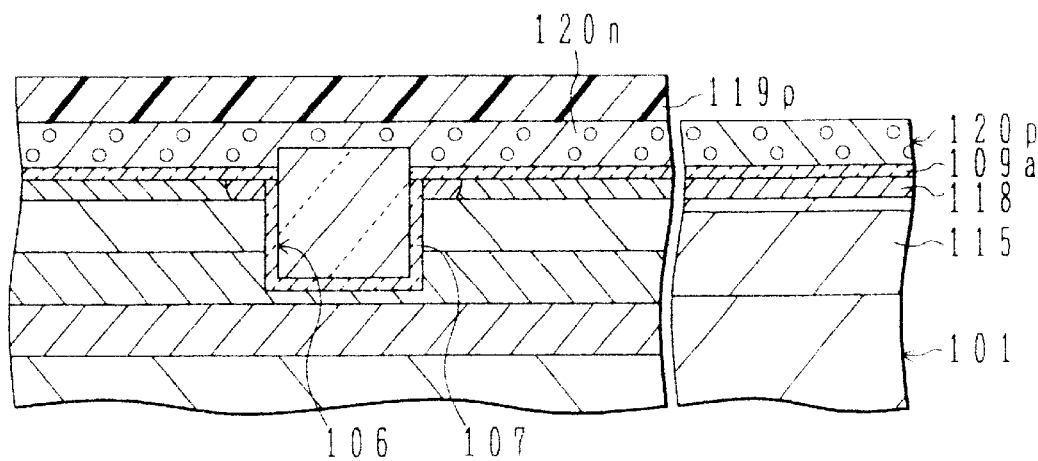

As shown in FIG. 8J, the memory cell area is covered with a resist pattern 119p to expose only the p-channel MOS transistor area. By using the resist pattern 119p as a mask, B$^+$ p-type impurity ions are implanted at an acceleration energy of 15 keV and a dose of $1 \times 10^{15}$ cm$^{-2}$ to form a p-type polysilicon layer 120p. Thereafter, the resist pattern 119p is removed.

With the above processes, the impurity doped region 117 for inversion prevention in the memory cell area and the n-type surface layer 118 in the p-channel MOS transistor area can be formed by same processes.

Figure 8K:
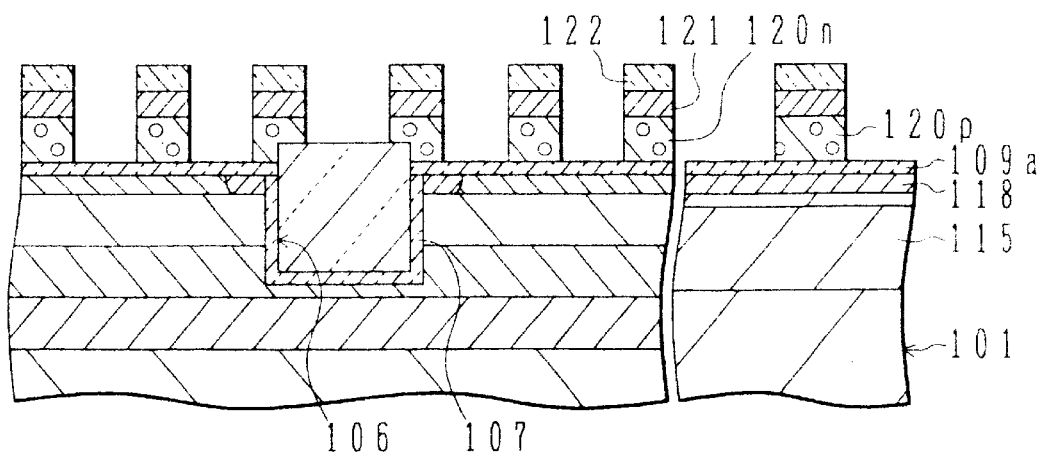

As shown in FIG. 8K, on the polysilicon layer 120, a WSi layer 121 as a low resistance gate electrode is deposited to a thickness of about 150 nm, for example, by CVD. On this WSi layer 121, a silicon nitride layer 122 as an insulative protective layer is deposited to a thickness of 150 nm, for example, by CVD. A resist pattern is formed on the silicon nitride layer 122, and the gate electrodes are patterned. Thereafter, the resist pattern is removed. The state shown in FIG. 8K shows the gate electrodes formed by the above processes. This state corresponds, for example, to the state shown in FIG. 1E. Thereafter, the processes shown in FIG. 1F and following drawings or known manufacture processes are performed to form memory cells, semiconductor elements in the peripheral circuit area, a wiring layer, an insulating layer, a protective layer, and the like to complete a semiconductor device.

In the above embodiments, a mask position alignment error is not taken into consideration. Different masks are used for implanting ions into the end portions of each active region and for patterning the word line (gate electrode). Therefore, there may be a mask position alignment error of these two masks. This mask position alignment limits the design rule as the patterning size becomes fine.

Figure 9A:
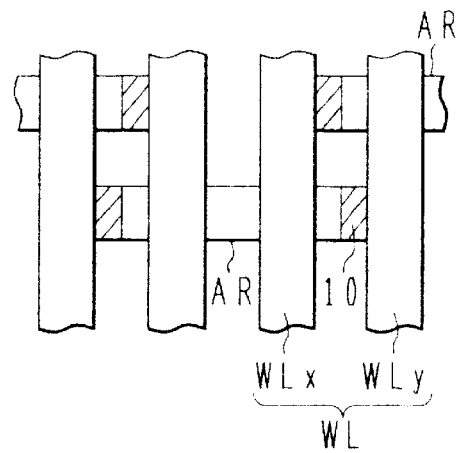
FIGS. 9A, 9B, 9C and 9D are plan views of semiconductor substrate.

FIG. 9A shows a relation of, an ion doped region 10 in the end portion of an active region AR, to a word line WL formed above the ion doped region 10 The following description involves studies on a relation of, the ion doped region 10 at the right end portion of the underlying active region AR, to word lines WLx and WLy disposed on both sides of the ion doped region 10. The word line WLx constitutes the gate electrode of a transistor belonging to the ion doped region 10, whereas the word line WLy is the adjacent word line. Since word lines are patterned by the same mask, a precision of a relative position of word lines is high. The ion doped region 10 is formed by a mask different from a mask used for patterning the word line WL. It is therefore necessary to take a position alignment error into consideration.

Figure 9B:
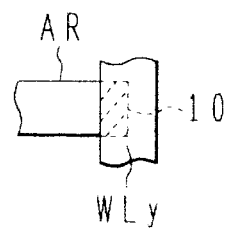

FIG. 9B illustrates a case wherein a word line mask is displaced to the left and the adjacent word line WLy overlaps the ion doped region 10 formed in the end portion of the active region AR. Even if the word line mask is displaced to the left and the adjacent word line WLy overlaps the active region AR, all the area of the active region AR overlapping the adjacent word line WLy is desired to be occupied by the ion doped region 10. If there is a region not doped with ions under the adjacent word line WLy, the retention characteristics may be deteriorated.

Figure 9C:
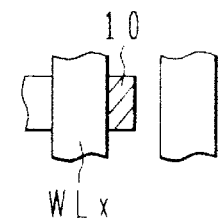

FIG. 9C illustrates a case wherein a word line mask is displaced to the right and the word line WLx constituting the gate electrode comes near the ion doped region 10. Even with such a position misalignment, it is desired that the ion doped region 10 does not overlap the word line WLx. If the ion doped region 10 creeps under the word line WLx, the threshold value of the transistor may be changed.

If there is such a position alignment error shown in FIGS. 9B and 9C, a space between adjacent word lines WL is required to be set to 2 m or larger where m is a position alignment error.

Impurity ions once implanted may extend or expand laterally thereafter. This lateral expansion is also influenced by the impurity concentration. In the case shown in FIG. 9B, the impurity concentration of the ion doped region 10 once formed and covered with the adjacent word line WLy will not be increased thereafter.

However, in the case shown in FIG. 9C wherein the ion doped region 10 is formed near the word line WLx, there is a possibility that the lateral expansion becomes larger than the case wherein the ion doped region 10 is positioned away from the word line WLx, when ions are implanted for forming the source/drain regions. Taking this lateral expansion of impurities into consideration, it may become necessary to increase the space between adjacent word lines more than that described above.

The space between adjacent word lines is required to be set to 2 m+d where d is a difference between the lateral expansions of the cases shown in FIGS. 9B and 9C. For example, assuming that the position alignment error m is about 60 nm and the lateral expansion difference d is 30 nm, the space between adjacent word lines is 2 m+d=150 nm.

When memories are formed basing upon the 0.13 µm rule, it is desired that the word line space is set to 130 nm. However, if the word line space is required to be 150 nm, it becomes difficult to design elements having the minimum line width. Even if the lateral expansion d is zero, as the position alignment error m increases, it may become difficult to design the word line space having the minimum line width.

Figure 9D:
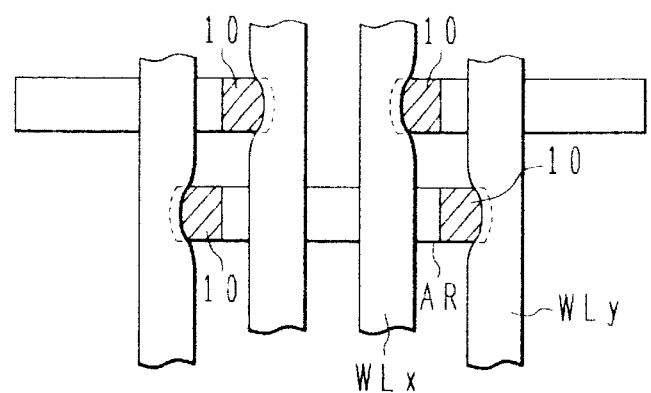

FIG. 9D is a plan view of a word line pattern according to another embodiment of the invention. An active region AR has ion doped regions 10 at opposite end portions thereof. A word line WL disposed near the ion doped region 10 has an inward curved area (side wall). By forming an inward curved area in the word line WL, the word line space margin becomes large in terms of the position alignment error.

Figure 9E:
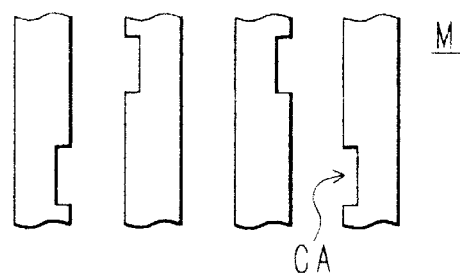
FIG. 9E is a plan view of a mask, illustrating another embodiment of the invention.

FIG. 9E shows an example of a mask pattern used for forming such a word line pattern. Assuming that the word lines WL each have a width of 130 nm and are disposed at a word line space of 130 nm, a recess CA having a width of 130 nm and a depth of 30 nm is formed in an area corresponding to the adjacent active region. When a resist pattern is exposed, the corners of the recess are rounded to have a shape such as shown in FIG. 9D. This resist pattern is therefore formed with an inward curved area having a depth of about 20 nm.

By utilizing such a word line pattern, the word line space can be designed in accordance with a minimum design rule even if the word line space compensating for the position alignment error exceeds the minimum design rule. A resistance increase because of the reduced line width of the word line can be compensated for by increasing the thickness of the word line.

Also in this embodiment, an ion implantation process for the end portions of each active region can be used in common with ion implantation for another area of the integrated circuit, so that an increase in the number of masks can be prevented.

Figure 10A:
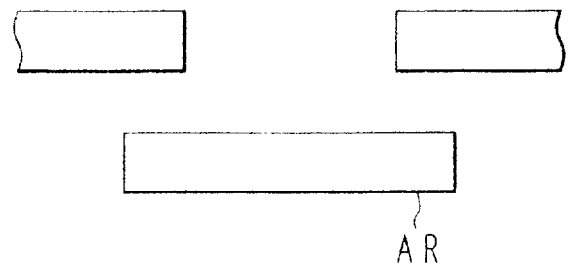
FIGS. 10A and 10B are plan views of a semiconductor substrate and a mask illustrating another embodiment of the invention.
Figure 10B:
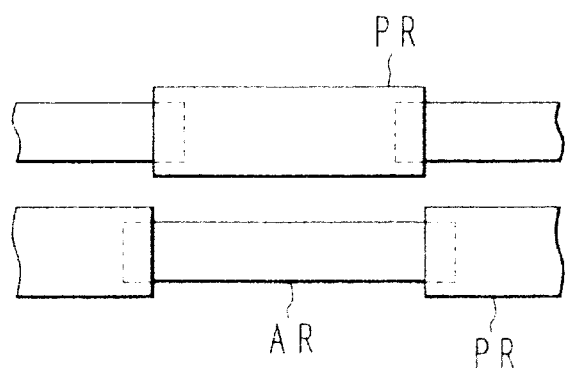

FIGS. 10A and 10B are plan views illustrating another embodiment of the invention.

As shown in FIG. 10A, n-type impurity ions are implanted in the whole area of a memory cell array. Each active region AR is set to a uniform impurity concentration.

As shown in FIG. 10B, the end portions of active regions are covered with a resist mask PR before impurity ions are implanted for adjusting the threshold value of memory transistors. In this state, p-type impurity ions are implanted. Since impurity ions of the opposite conductivity type are not implanted into the end portions of active regions, the n-type doped regions are left.

Also in this embodiment, a mask dedicated to forming an ion doped region in the end portions of active regions is not necessary so that the number of masks can be reduced. Ion implantation into the whole areas of the active regions shown in FIG. 10A can be shared with ion implantation for adjusting the threshold value of transistors other than the memory cells.

Figure 11:
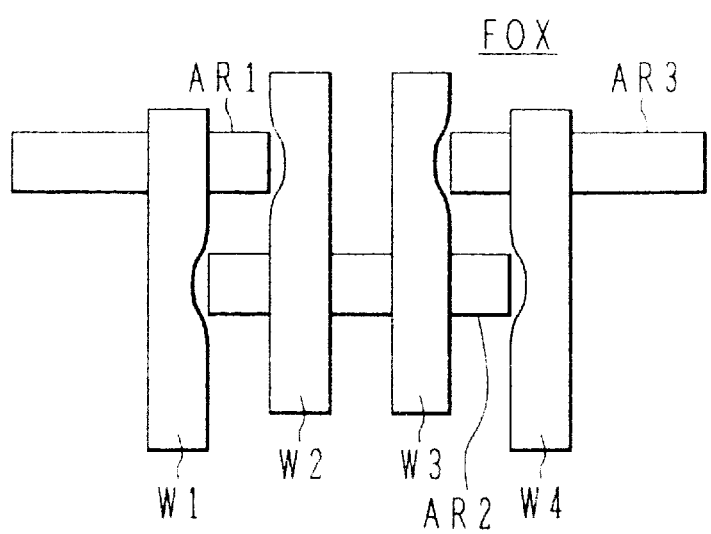
FIG. 11 is a plan view of a semiconductor substrate illustrating another embodiment of the invention.

FIG. 11 is a plan view of a semiconductor substrate illustrating another embodiment of the invention. On the surface of the semiconductor substrate, an isolation insulating film FOX such as a field oxide film is formed to define active regions AR1, AR2, . . . . On the active regions AR defined by the isolation insulating film, gate insulating films such as gate oxide films are formed. On the gate insulating film, a gate electrode layer is formed.

A resist pattern is formed on the gate electrode layer to pattern word lines W1, W2, W3, . . . . Similar to the embodiment shown in FIG. 9, each word line W has an inwardly curved area near each adjacent active region. Taking as an example the active region AR2, the word lines W2 and W3 formed above the active region AR2 each have a constant width above the region AR2, whereas the word line W1 adjacent to the left end of the active region AR2 has an inward curved area in an area facing the end portion of the active region AR2. Similarly, the word line W4 adjacent to the right of the active region AR2 has an inward curved area in an area facing the end portion of the active region AR2.

Different points from the embodiment shown in FIG. 9 are that the word lines W1 and W4 and the active region AR2 have no overlapped area and that impurity ions are not implanted into the end portions of the active region. By forming the inward curved area in the word line (gate electrode), a space to an adjacent active region has a margin and the active region does not creep under the word line.

This embodiment is particularly effective for the case wherein the isolation insulating film is realized by trench isolation. Since ions are not implanted into the end portions of active regions, there is no additional process. For example, after the process shown in FIG. 1B, the processes shown in FIGS. 1C and 1D are omitted to follow the process shown in FIG. 1E. Thereafter, ordinary DRAM manufacture processes are performed to form one of the source/drain regions in the active region AR2 between the word lines W2 and W3, the other ones of the source/drain regions in the end portions of the active regions AR2, a bit line connected to the one of the source/drain regions, and capacitors connected to the other ones of the source/drain regions.

The present invention has been described in connection with the preferred embodiments. The invention is not limited only to the above embodiments. For example, the invention is applicable to any semiconductor device having memory cells different from DRAM devices. For example, integrated circuit devices such as a digital signal processor (DSP) including memory elements and an application specific (AS) IC can also be formed. The configurations of a capacitor and other elements and the layout thereof can be modified in various ways. It will be apparent to those skilled in the art that various modifications, improvements, combinations, and the like can be made.

What is claimed is:

1. A method of manufacturing a semiconductor device, comprising the steps of:
    forming an element isolation insulating film in a principal surface of a first conductivity type area of a semiconductor substrate, the element isolation insulating film defining an active region;
    selectively introducing impurities of a second conductivity type opposite to the first conductivity type into end portions of the active region to form first impurity doped regions;
    forming a gate insulating film on the active region;
    forming a word line made of conductive material on the gate insulating film, a pattern of the word line not overlapping the first impurity doped region, traversing the active region, and extending in one direction as a whole;
    introducing impurities of the second conductivity type into the active region by using the word line and the element isolation insulating film as a mask, to form second impurity doped regions at least partially overlapping the first impurity doped regions; and
    forming a capacitor connected to one of the second impurity doped regions and extending over the word line.

2. A method of manufacturing a semiconductor device according to claim 1, wherein said step of forming the word line forms a word line at a position away from the first impurity doped region.

3. A method of manufacturing a semiconductor device according to claim 1, wherein said step of forming the word line forms at the same time another word line adjacent to the word line, the another word line extending on the first impurity doped region.

4. A method of manufacturing a semiconductor device according to claim 1, wherein said step of forming the first impurity doped region comprises the sub-steps of:
    forming a mask having an opening which exposes end portions of the active region and a partial area of the element isolation insulating film; and
    implanting impurity ions of the second conductivity type into the semiconductor substrate, by using the mask.

5. A method of manufacturing a semiconductor device according to claim 1, wherein said step of forming the element isolation insulating film comprises the sub-steps of:
    forming a mask on the semiconductor substrate;
    anisotropically etching the semiconductor substrate by using the mask, to form a recess having a generally vertical side wall;
    forming an insulating film on the semiconductor substrate, the insulating film filling the recess; and
    polishing the insulating film.

6. A method of manufacturing a semiconductor device according to claim 1, wherein said step of forming the element isolation insulating film includes a step of selectively and thermally oxidizing the principal surface of the semiconductor substrate by using an oxidation resistant mask to form an oxide film having a bird's beak, and said step of forming the first impurity doped region forms the first impurity doped region creeping under the bird's beak.

7. A method of manufacturing a semiconductor device according to claim 1, further comprising a step of forming an interlayer insulating film covering the semiconductor substrate after said step of forming the second impurity doped region, wherein said step of forming the capacitor forms an opening through the interlayer insulating film and reaching the second impurity doped region.

8. A method of manufacturing a semiconductor device according to claim 7, further comprising the steps of:
    forming a first insulating film over the semiconductor substrate after said step of forming the second impurity doped region, the first insulating film covering the word line and having etching characteristics different from the interlayer insulating film; and
    forming side wall insulating films on side walls of the word line by anisotropically etching the first insulating film,
    wherein said sub-step of forming the opening is a self-aligned process utilizing the side wall insulating films.

9. A method of manufacturing a semiconductor device according to claim 8, wherein said step of forming the word line comprises the sub-steps of:
    forming a conductive layer;
    forming a second insulating film on the conductive layer, the second insulating film having etching characteristics different from the interlayer insulating film; and
    patterning the second insulating film and the conductive layer by using a same mask.

10. A method of manufacturing a semiconductor device according to claim 1, wherein said step of forming the element isolation insulating region forms an element isolation insulating region defining another active region of the first conductivity type, said step of forming the first impurity doped region forms a third impurity doped region in the another active region, said step of forming the gate insulating film forms a capacitor dielectric film on the third impurity doped region, and said step of forming the word line forms a capacitor upper electrode on the capacitor dielectric film.

11. A method of manufacturing a semiconductor device according to claim 1, wherein said step of forming the word line forms at the same time another word line adjacent to the word line, the another word line extending on the first impurity doped region.

12. A method of manufacturing a semiconductor device, comprising the steps of:
    forming an element isolation insulating film in a principal surface of a first conductivity type area of a semiconductor substrate, the element isolation insulating film defining an active region;
    selectively introducing impurities of a second conductivity type opposite to the first conductivity type into end portions of the active region to form first impurity doped regions;
    forming a gate insulating film on the active region;

forming a word line made of conductive material on the gate insulating film, a pattern of the word line not overlapping the first impurity doped region, traversing the active region, and extending in one direction as a whole;

introducing impurities of the second conductivity type into the active region by using the word line and the element isolation insulating film as a mask, to form second impurity doped regions only partially overlapping the first impurity doped regions; and forming a capacitor connected to one of the second impurity doped regions and extending over the word line.

13. A method of manufacturing a semiconductor device according to claim 12 wherein said step of forming the word line forms a word line at a position away from the first impurity doped region.

14. A method of manufacturing a semiconductor device according to claim 12 wherein said step of forming the first impurity doped region comprises the sub-steps of:

forming a mask having an opening which exposes end portions of the active region and a partial area of the element isolation insulating film; and implanting impurity ions of the second conductivity type into the semiconductor substrate, by using the mask.

15. A method of manufacturing a semiconductor device according to claim 12, wherein said step of forming the element isolation insulating film comprises the sub-steps of:

forming a mask on the semiconductor substrate;

anisotropically etching the semiconductor substrate by using the mask, to form a recess having a generally vertical side wall;

forming an insulating film on the semiconductor substrate, the insulating film filling the recess; and polishing the insulating film.

16. A method of manufacturing a semiconductor device according to claim 12 wherein said step of forming the element isolation insulating film includes a step of selectively and thermally oxidizing the principal surface of the semiconductor substrate by using an oxidation resistant mask to form an oxide film having a bird's beak, and said step of forming the first impurity doped region forms the first impurity doped region creeping under the bird's beak.

17. A method of manufacturing a semiconductor device according to claim 12, further comprising a step of forming an interlayer insulating film covering the semiconductor substrate after said step of forming the second impurity doped region, wherein said step of forming the capacitor forms an opening through the interlayer insulating film and reaching the second impurity doped region.

18. A method of manufacturing a semiconductor device according to claim 17, further comprising the steps of:

forming a first insulating film over the semiconductor substrate after said step of forming the second impurity doped region, the first insulating film covering the word line and having etching characteristics different from the interlayer insulating film; and forming side wall insulating films on side walls of the word line by anisotropically etching the first insulating film, wherein said sub-step of forming the opening is a self-aligned process utilizing the side wall insulating films.

19. A method of manufacturing a semiconductor device according to claim 18, wherein said step of forming the word line comprises the sub-steps of:

forming a conductive layer;

forming a second insulating film on the conductive layer, the second insulating film having etching characteristics different from the interlayer insulating film; and patterning the second insulating film and the conductive layer by using a same mask.

20. A method of manufacturing a semiconductor device according to claim 12, wherein said step of forming the element isolation insulating region forms an element isolation insulating region defining another active region of the first conductivity type, said step of forming the first impurity doped region forms a third impurity doped region in the another active region, said step of forming the gate insulating film forms a capacitor dielectric film on the third impurity doped region, and said step of forming the word line forms a capacitor upper electrode on the capacitor dielectric film.

* * * * *